United States Patent [19]

Fitzgerald, Jr. et al.

[11] Patent Number: 5,032,893
[45] Date of Patent: Jul. 16, 1991

[54] METHOD FOR REDUCING OR ELIMINATING INTERFACE DEFECTS IN MISMATCHED SEMICONDUCTOR EIPLAYERS

[75] Inventors: Eugene A. Fitzgerald, Jr.; Dieter G. Ast, both of Ithaca, N.Y.

[73] Assignee: Cornell Research Foundation, Inc., Ithaca, N.Y.

[21] Appl. No.: 560,249

[22] Filed: Jul. 27, 1990

Related U.S. Application Data

[63] Continuation of Ser. No. 176,477, Apr. 1, 1988, abandoned.

[51] Int. Cl.$^5$ .................. H01L 29/04; H01L 27/12; H01L 29/161; H01L 29/06
[52] U.S. Cl. .................................. 357/60; 357/4; 357/16; 357/55
[58] Field of Search ................... 357/60, 16, 55, 4

[56] References Cited

U.S. PATENT DOCUMENTS

| | | | |
|---|---|---|---|
| 3,906,541 | 9/1975 | Goronkin | 357/22 |
| 3,962,716 | 6/1976 | Petroff et al. | 357/18 |
| 4,099,305 | 7/1978 | Cho et al. | 29/579 |
| 4,171,234 | 10/1979 | Nagata et al. | 148/175 |
| 4,174,422 | 11/1979 | Matthews et al. | 428/621 |
| 4,255,206 | 3/1981 | Endler et al. | 148/171 |
| 4,279,688 | 7/1981 | Abrahams et al. | 156/613 |
| 4,558,336 | 12/1985 | Chang et al. | 357/4 |
| 4,596,999 | 6/1986 | Gobrecht et al. | 357/22 |
| 4,806,996 | 2/1989 | Luryi | 357/16 |

OTHER PUBLICATIONS

Rosenberg, J. J. et al, IEEE EDL 6:491 (1985).
Ramberg, L. P. et al, J. Appl. Phys., 61:1234 (1987).
Katsumoto, S. et al, J. Appl. Phys., 24:636 (1985).
Matthews, J. W. et al, J. Appl. Phys., 41:3800 (1970).
Matthews, J. W. et al, Thin Solid Films, 33:253 (1976).
Hagen et al, Appl. Phys., 17:85 (1978).
Strunk et al, Appl. Phys., 18:67-75 (1979).
Ito, H. et al, Japanese Journal of Appl. Phys., 25:421-424 (1986).
Fitzgerald, E. A. et al, Appl. Phys. Lett., 52:1496-1498 (1988).

Primary Examiner—Andrew J. James
Assistant Examiner—Stephen D. Meier
Attorney, Agent, or Firm—Jones, Tullar & Cooper

[57] ABSTRACT

The present invention and process relates to crystal lattice mismatched semiconductor composite having a first semiconductor layer and a second semiconductor growth layer deposited thereon to form an interface wherein the growth layer can be deposited at thicknesses in excess of the critical thickness, even up to about 10x critical thickness. Such composite has an interface which is substantially free of interface defects. For example, the size of the growth areas in a mismatched $In_{0.05}Ga_{0.95}As/(001)GaAs$ interface was controlled by fabricating 2-$\mu$m high pillars of various lateral geometries and lateral dimensions before the epitaxial deposition of 3500Å of $In_{0.05}Ga_{0.95}As$. The linear dislocation density at the interface was reduced from >5000 dislocations/cm to about zero for 25-$\mu$m lateral dimensions and to less than 800 dislocations/cm for lateral dimensions as large as 100 $\mu$m. The fabricated pillars control the lateral dimensions of the growth layer and block the glide of misfit dislocations with the resultant decrease in dislocation density.

17 Claims, 5 Drawing Sheets

10μm

10μm

10μm

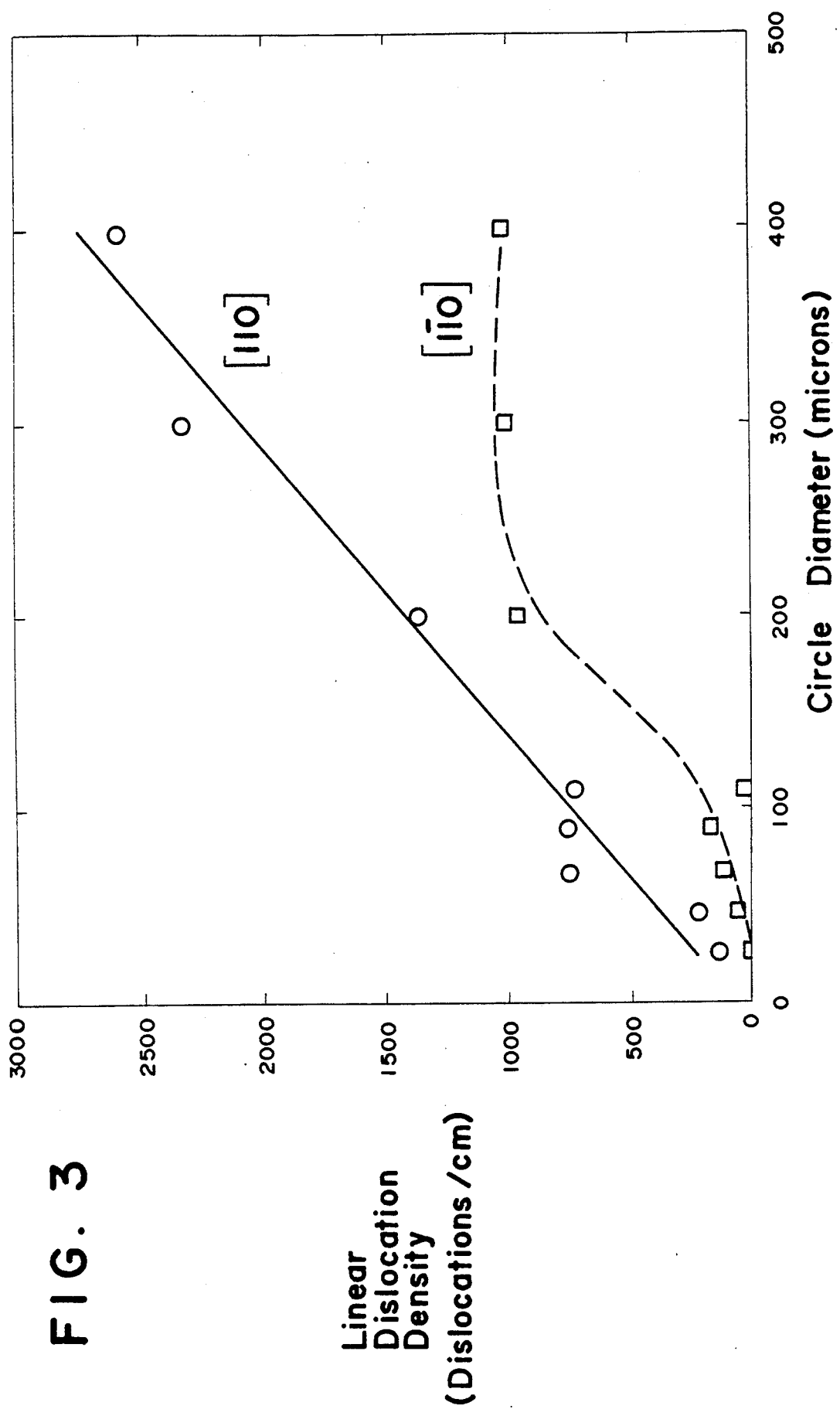

METHOD FOR REDUCING OR ELIMINATING INTERFACE DEFECTS IN MISMATCHED SEMICONDUCTOR EIPLAYERS

This invention was made in part under the Department of Energy Subcontract Grant No. DE-FG02-86ER45278. The U.S. has certain rights to this invention.

This application is a continuation of application Ser. No. 07/176,477, filed Apr. 1, 1988 now abandoned.

This invention relates to semiconductor materials having crystal lattice mismatched surfaces and interface comprising a first semiconductor layer (sometimes referred to as substrate) and a second semiconductor layer deposited on the first semiconductor layer wherein the thickness of the deposited layer exceeds the critical thickness and to a process for eliminating and/or reducing interface defects by modifying the first semiconductor layer prior to epitaxial deposition of the second semiconductor material.

BACKGROUND OF THE INVENTION

In the manufacture of the highest performance devices today, two dissimilar semiconductors must be placed in close proximity to each other; as a matter of fact, an abrupt interface is necessary. For example, $In_xGa_{1-x}As$ on GaAs is a technologically important system since high speed devices such as high electron mobility transistors (HEMTs) and heterojunction bipolar transistors (HBTs) may be manufactured from this material. The more In that is added to the $In_xGa_{1-x}As$, the better the properties. The properties of the $In_xGa_{1-x}As$ can be estimated from linearly extrapolating between the binary compounds InAs and GaAs.

The problem that occurs in the majority of the cases is that two dissimilar semiconductors that have dissimilar electronic properties (the advantage) have dissimilar structural properties as well (the disadvantage). For example, as one adds more In to $In_xGa_{1-x}As$ to take advantage of the electronic properties of the $In_xGa_{1-x}As$ and the $In_xGa_{1-x}As/GaAs$ abrupt interface, one also increases the size of the lattice constant. Therefore, when one deposits crystalline $In_xGa_{1-x}As$ on GaAs, defects form at the interface due to the difference in the size of the crystal structure. These defects can destroy the electronic properties of the material since they can trap electrons and holes. This property of the crystalline defects can be used to actually image the defects, identify them, and determine when they have been eliminated. Thus, it would be beneficial to fabricate mismatched semiconductor materials having an abrupt interface and reduced or eliminated defect density.

The lattice-mismatched semiconductor systems have been extensively investigated for the realization of strained-layer devices. Promising devices have been fabricated by Rosenberg, J. J. et al, IEEE EDL 6:491 (1985); Ramberg, L. P. et al, J. Appl. Phys., 61:1234 (1987); and Katsumoto, S. et al, J. Appl. Phys., 24:636 (1985) using the InGaAs/GaAs system. However, higher In concentrations and thicker overlayers are needed in the future for increased device performance. In order to realize these devices, the dislocation density created by the lattice mismatch for high In or large epilayer thicknesses must be reduced, or, preferably eliminated. Therefore, the nucleation sites for misfit dislocations must be prevented from operating or their effect must be minimized. Nucleation mechanisms such as threading dislocations, multiplication of misfit dislocations, and surface dislocation half-loop formation have been discussed by Matthews, J. W. et al, J. Appl. Phys., 41:3800 (1970); Thin Solid Films, 33:253 (1976); and J. Vac. Sci. Technol., 12:126 (1975). Dislocation multiplication has been discussed in detail by Hagen and Strunk, Appl. Phys., 17:85 (1978). Matthews originally attributed misfit dislocation formation to the bending over of threading dislocations. It was proposed that if threading dislocations were the source of misfit dislocations, then by limiting the lateral dimension of the sample before growth, not enough threading dislocations would be present to nucleate misfit dislocations and therefore the interface defect density would decrease. However, it was observed that density of misfit dislocations at the interface is greater than the number of threading dislocations. Hagen and Strunk proposed the interaction of misfit dislocations as an additional source of misfit dislocations, and Matthews considered the surface nucleation of dislocation half-loops.

SUMMARY OF THE INVENTION

One object of the present invention is a semiconductor structure having a crystal lattice mismatched interface and a growth layer thickness in excess of the critical thickness and a process to eliminate interface defects in such systems.

Another object of the present invention is a semiconductor material composite structure formed from two crystal lattice mismatched semiconductor materials comprising a first semiconductor material layer and a second semiconductor material layer deposited on said first semiconductor material layer to form an interface therewith wherein the thickness of the second semiconductor layer is in excess of the critical thickness and wherein interface defects between said first and second layer are reduced or eliminated; wherein the lateral dimensions of the second layer are controlled by patterning the first semiconductor layer to form a multiplicity of pillars and adjacent wells prior to deposit of the second layer thereon, said pillar, well and said second layer having a lateral dimension up to about 5000 $\mu m$; and wherein the second semiconductor material is deposited on the pillar and well in amounts up to about ten times the critical thickness.

Another object of the invention is to control the size of the growth areas and reduce the linear dislocation density at the interface of a mismatched crystal lattice semiconductor composite of the present invention represented by the formulas: $M^1_xM^1_{1-x}$ $M^3_yM^4_{1-y}/M^5_z^6_{1-z}M^7_wM^8_{1-w}$; $M^1_xM^2_{1-x}M^3_yM^4_{1-y}/M^9$; and $M^9_xM^{10}_{1-x}/M^{10}$ or their inverse counterparts where $M^1$, $M^2$, $M^5$ and $M^6$ are elements of Group IIIA and IIB; $M^3$, $M^4$, $M^7$ and $M^8$ are elements of Group VA and Group VIA of the periodic table of elements and where W, X, Y and Z are values from 0 to 1.

A further object of the invention is to reduce dislocation density at the interface of certain mismatched semiconductors from >5000 dislocations/cm to about zero for 25 $\mu m$ lateral dimensions and to less than 800 dislocations/cm for lateral dimensions as large as 100 $\mu m$.

A yet further object of the present invention is a semiconductor article wherein interface defects were eliminated from mismatched $In_{0.05}Ga_{0.95}As/(001)$ GaAs interface by fabricating 2 $\mu m$ high pillars of various lateral geometries and lateral dimensions on the GaAs layer prior to deposition of 3500Å $In_{0.05}Ga_{0.95}As$.

Yet another object of the present invention is a process for eliminating or substantially reducing the defect density at the interface of a mismatched crystal lattice semiconductor material structure comprising, a first semiconductor material layer and a second semiconductor material layer deposited on said first semiconductor material wherein the deposited layer thickness is in excess of the critical thickness comprising:

a) forming a first semiconductor layer;
b) patterning the first semiconductor layer to form a multiplicity of pillars and adjacent wells prior to deposit of the second layer thereon, said pillar, well and said second layer having a lateral dimension up to about 5000 μm; the height of said pillar and said well being sufficient to accept the second layer deposit in a thickness in excess of the critical thickness of said layer;
c) depositing the second semiconductor layer on said pillars and wells wherein the layer thickness is in excess of the critical thickness and the layer is discontinuous to provide a composite having an interface substantially free of interface defects;

wherein the number of dislocations at the interface between the first semiconductor material and the second semiconductor material is from about 0 to about 1000 dislocations per centimeter, said pillars have a height of from about 10Å to about 500 μm preferably below 200 μm and most preferably from 10Å to 2 μm; and said pillars and wells have a lateral dimension up to about 5000 μm.

BRIEF DESCRIPTION OF THE DRAWINGS

FIG. 3 is a plot of linear dislocation density vs the diameter of the pillar for the two <110> directions.

DETAILED DESCRIPTION OF THE INVENTION

Figure 1A:
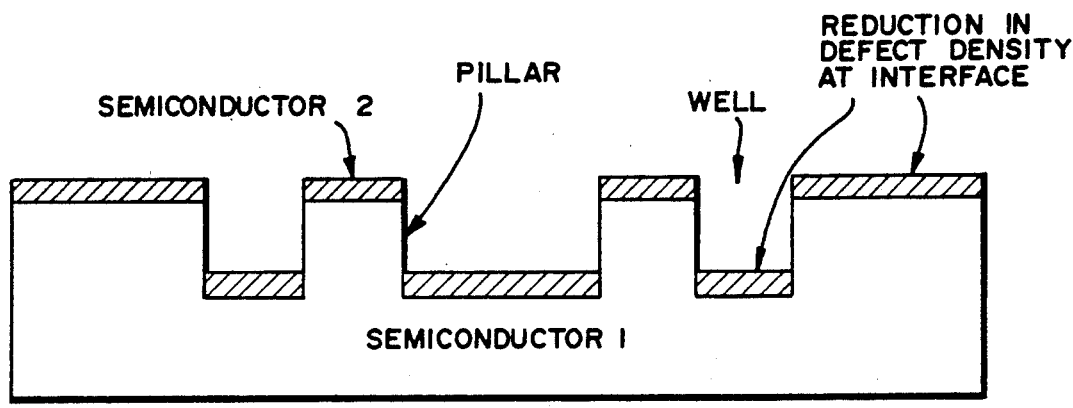
FIG. 1A is a schematic of the mismatched semiconductor structure with the modified pillared first semiconductor material layer fabricated with a multiplicity of pillars and wells prior to the epitaxial deposition of the second semiconductor material layer.
Figure 1B:
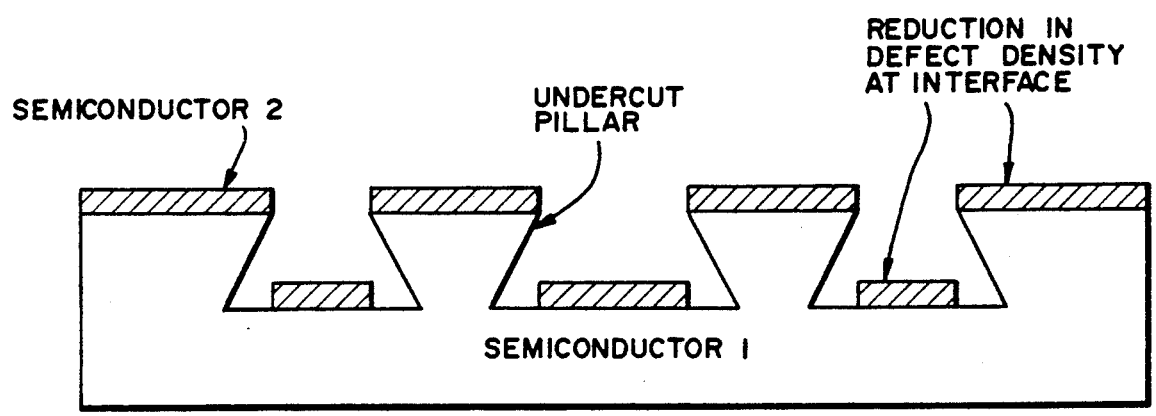
FIG. 1B is a schematic showing pillars having an undercut structure with sloping side walls.

The invention relates to a process for eliminating interface defects between crystal lattice mismatched semiconductor materials by patterning on the first semiconductor material a plurality of pillars having various lateral geometries and dimensions prior to the deposition of a second semiconductor layer thereon preferably by epitaxial deposition. Such processing reduces the interface stresses due to the fact that the substrate surface area is broken up by the pillars into a plurality of small surface areas thereby eliminating or greatly reducing the interface defects.

The semiconductor material composite structure of the present invention formed from two crystal lattice mismatched semiconductor materials comprises a first semiconductor material layer and a second semiconductor material layer deposited on said first semiconductor material layer to form an interface therewith wherein the thickness of the second semiconductor layer or growth layer is in excess of the critical thickness and wherein said interface is substantially free of interface defects.

By the term "substantially free of interface defects" is meant that the dislocation density at the mismatched interface between the first semiconductor layer and the second semiconductor layer deposited thereon is from about 0 up to a value less than the value of a corresponding semiconductor composite for large deposit areas, i.e. those having lateral dimensions greater than 5000 μm. Because the acceptable dislocation density maximum vary from one semiconductor composite system to another it is appropriate, for this invention, to define acceptable values in comparison to its counterpart system having large lateral dimensions (>5000 μm) and unacceptable semiconductor properties when the thickness of the deposited layer exceeds the critical thickness. Although nearly zero defects will obtain in certain systems as for example GaAs/InGaAs with lateral dimension of 25 μm, acceptable defect values of up to about 800 dislocations per cm and often up to 1000 will result at lateral dimensions of 100 μm.

By "critical thickness" in the deposition of a second semiconductor layer on a first semiconductor material is meant the thickness of the second semiconductor at which misfit dislocations begin to form at the interface, namely the onset of the dislocations. In the early stages of deposition, the interface is coherent and the deposited layer is said to be commensurate. In this stage, the two lattices match exactly and the stress energy is not large enough to form interface dislocations. When the critical thickness (by deposition) is exceeded, dislocations form at the interface and the layer is said to be incoherent.

Many devices employing heterojunctions are based upon the approximately latice matched $Al_xGa_{1-x}As$/GaAs heterojunction. However, deep levels in $Al_xGa_{1-x}As$ limit device performance. One alternative system is the $In_xGa_{1-x}As$/GaAs system. Devices using this heterojunction include solar cells, high electron mobility transistors, and heterojunction bipolar transistors.

A large lattice mismatch is the major problem in the InGaAs/GaAs system. The strain can be accommodated elastically for single $In_xGa_{1-x}As$ epilayers if the thickness is less then the critical thickness for defect formation. However, many potential uses require high indium concentrations and/or thick epilayers. Under such conditions, misfit dislocations will form. The structure and electrical activity of mismatched epilayers such as InGaAs/GaAs can be characterized by various techniques including Scanning Electron Microscopy (SEM), Cathodoluminescence (CL), and Transmission Electron Microscopy (TEM).

In a typical mismatched semiconductor device such as $In_xGa_{1-x}As$/GaAs, when $In_xGA_{1-x}As$ (the second semiconductor material) is deposited on GaAs (the first semiconductor material), initially no defects will form, and the larger $In_xGa_{1-x}As$ crystal will be compressed so it will fit coherently on top of the GaAs. Thus the $In_xGa_{1-x}As$/GaAs interface is free from misfit defects and the $In_xGa_{1-x}As$ is totally elastically strained. However, after a certain thickness when the elastic energy becomes too high (called the critical thickness), misfit dislocations form and glide to the interface from nucleation sources. The critical thickness is inversely related to the amount of In the $In_xGa_{1-x}As$. Thus at high In concentrations, the critical thickness is very small and very thin $In_xGa_{1-x}As$ layers must be grown. Each misfit dislocation that is able to glide to the interface (after the critical thickness has been reached) is able to relieve some of the elastic stress in the $In_xGa_{1-x}As$ because it allows the $In_xGa_{1-x}As$ to relax, i.e. become less compressed. Presently, $In_xGa_{1-x}As$, is grown over large areas (wafers) and the concentration and thickness are kept low enough that the critical thickness is not reached and there will not be any interface defects present. However, devices fabricated in this way must have low In concentrations and/or thicknesses.

In contrast to the above, a method has been found to eliminate or substantially lower interface defects in systems having a thickness greater than the critical thickness. In fact, interface defects were reduced or eliminated in systems where the critical thickness was exceeded by a factor of ten. This invention thus allows the growth of materials of high crystalline quality that otherwise would have many interface defects. This process is applicable to all mismatched systems.

The dislocation density can be reduced by either growing on the top of vertical structures (pillars) or in between the structures (wells). It is shown that one type of dislocation, presumably the faster $\alpha$ dislocation, nucleates much more readily than the $\beta$ dislocations. The dependence of the interface defect density on lateral dimensions can lead to an increased understanding of misfit dislocation nucleation as well as the fabrication of previously unattainable devices. Because this technique is based upon the fundamentals of misfit dislocation nucleation, it is not limited to any one material system. Different composite systems will have different minimum and maximum values which, although not the same as the GaAs/InGaAs system, will be deemed "substantially free of interface defects" when the individual values are compared at lateral dimensions above and below 5000 $\mu$m.

The semiconductor composites of the present invention are prepared by a process for eliminating or substantially reducing the defect density at the interface of a mismatched crystal lattice semiconductor material structure comprising, a first semiconductor material layer and a second semiconductor material layer deposited on said first semiconductor material wherein the deposited layer thickness is in excess of the critical thickness which comprises the following steps:
  a) forming a first semiconductor layer;
  b) patterning the first semiconductor layer to form a multiplicity of pillars and adjacent wells prior to deposit of the second layer thereon, said pillar, well and said second layer having a lateral dimension up to about 5000 $\mu$m; the height of said pillar and said well being sufficient to accept the second layer deposit in a thickness in excess of the critical thickness of said layer; said pillar being of specified lateral dimension sufficient to provide a discontinuity in the applied layer and thus limit the surface of the applied layer to the linear dimension of the pillar or well;
  c) depositing the second semiconductor layer on said pillars and wells wherein the layer thickness is in excess of the critical thickness;

In the practice of this process, the number of dislocations at the interface between the first semiconductor material and the second semiconductor material is from about 0 to about 1000 dislocations per centimeter, preferably not greater than 800 dislocations per centimeter. These ratings will vary somewhat with the type of composite as described above.

While pillar fabrication of patterns in the form of circles are preferred, pillars of different geometries including squares, triangles, rectangles, and the like, can be used to effect the same result, namely the reduction of interface defects in mismatched interfaces. Pillars with an undercut profile and oblique (sloping) side walls are quite suited for this invention. Undercut pillars have the advantage that they increase the physical discontinuity between overlay material in the valleys and on the pillar tops. Pillars having a planar top portion, a narrow base portion with sloping side walls that undercut the top portion of the pillar are advantageous in that they foster the discontinuity and thus limit the growth layer lateral dimension. Such pillars have a height of from about 10 Å to about 5000 $\mu$m, preferably below 200 $\mu$m and most preferably from about 10Å to about 2 $\mu$m. The pillars and wells have a lateral dimension up to about 5000 $\mu$m and lateral growth is limited essentially to such parameter.. Especially preferred structures are there having a pillar height of from about 2 $\mu$m or less where the pillars and wells have a lateral dimension of from about 15 to about 100 $\mu$m. It is preferred that the pillars height be greater than the thickness of the deposited layer. It is important in eliminating interface defects that the applied semiconductor layer, preferably applied by epitaxial deposition, be discontinuous with respect to its lateral dimensions. In turn such dimensions are dictated by the corresponding dimensions of the pillar and well sections, thus creating lateral brakes or interruptions in the deposited layer. Such process restricts lateral growth without hindering vertical growth.

By "discontinuous" is meant that the first semiconductor layer is physically patterned and dimensioned so that the deposited second semiconductor layer is not continuous over the entire surface but is said to be discontinuous because the second semiconductor "growth" layer is deposited on the pillars and in the wells and are thus distinct and separate areas of limited lateral dimension.

For the purposes of the instant invention, epitaxial deposition methods are preferred. By epitaxial deposition is meant a deposition process wherein the second semiconductor material being deposited is deposited in single crystal form on top of the first semiconductor material. Such methods include Molecular Beam Epitaxy (MBE), Organometallic Chemical Vapor Deposition (MOCVD or OMCVD), Gas Source Molecular Beam Epitaxy and Liquid Phase Epitaxy (LPE) and the like.

Other methods of forming defect free crystal lattice semiconductors wherein the critical thickness of the second semiconductor will be apparent to those skilled in the art. For example, a polycrystalline or amorphous second layer may be deposited in amounts greater than the critical thickness by conventional methods of deposition and the layer then transformed to the single crystal state by conventional methods. Such deposition methods include chemical vapor deposition, electron beam evaporation and the like followed by ion beam and/or thermal annealing.

The crystal lattice mismatched semiconductor composite of the present invention can be generically represented by the formulas: $M^1{}_xM^2{}_{1-x}M^3{}_yM^4{}_{1-y}/M^5{}_zM^6{}_{1-z}M^7{}_wM^8{}_{1-w}$; $M^1{}_x M^2{}_{1-x}M^3{}_yM^4{}_{1-y}/M^9$; and $M^9{}_xM^{10}{}_{1-x}/M^{10}$ or their inverse counterparts; where $M^1$, $M^2$, $M^5$ and $M^6$ are elements of Group IIIA and IIB; $M^3$, $M^4$, $M^7$ and $M^8$ are elements of Group VA and Group VIA and $M^9$ and $M^{10}$ are elements of Group IVA of the periodic table of elements and where W, X, Y and Z are values from 0 to 1.

One variant of the above formula is a composite of the structure $M^1_xM^2_{1-x}M^3/M^2M^3$ where $M^1M^2$ and $M^3$ are elements of Group IIB, IIIA, IVA, VA and VIA of the periodic table and x is 1 or 1. One example of such mismatched interface is $In_{0.05}Ga_{0.95}As/(001)GaAs$. In such system the pillars are fabricated from the $M^2M^3$ semiconductor prior to the epitaxial deposition of $M^1_{0.05}M^2_{0.95}M^3$ where the pillar height is advantageously about 2-μm and the lateral dimension of the deposited layer on the pillar or well is from about 15 to 200 μm. In another variation $M^1$, $M^2$ and $M^3$ are elements of Group III and V and x is 1. In another variant of $M^1_xM^1_{1-x}M^3/M^2M^3$, x is equal to zero.

A further variant to the general formula is a structure of the type $M^1M^2/M^3M^4$ where $M^1$, $M^2$, $M^3$ and $M^4$ are elements of Group IIB, IIIA, VA and VIA. An example of this structure is where $M^1$ and $M^2$ are Group IIIA and Group VA elements and $M^3$ and $M^4$ are elements of Group IIB and Group VIA respectively. A specific structure is ZnSe/GaAS or its inverse.

Another variant can be represented by the formula $M^1M^2/M^3$ wherein $M^1$, $M^2$ and $M^3$ are elements of Groups IIIA, IVA and VA. One example is where $M^1$ and $M^2$ are Group IIIA and Group VA elements and the deposited element $M^3$ is a Group IVA element. A specific structure is where $M^1$ is gallium; $M^2$ is arsenic and $M^3$ is silicon. It will be appreciated that in all of the above examples, the inverse structure can be used in the present invention.

Other important examples [f the present invention include $Si_xGe_{1-x}$ on Si; GaAs on $Si_xGe_{1-x}$; Ge on Si; ZnSe on Si; and their inverted structures.

The invention describes the elimination or reduction of defect density between any two mismatched semiconductor layers. Therefore, multilayered structures can also be grown on patterned substrates to reduce the number of, or eliminate, interface misfit dislocations. For example, heterojunction bipolar transistors, electron mobility transistors, and photodetectors composed of high mismatched semiconductor layers of superlattices can benefit from the defect density reduction described in this invention.

Although the examples exemplify a system to reduce defect density of a mismatched semiconductor on top of another semiconductor, superlattices which exceed critical layer thickness will also benefit. If a multi-layered structure is grown beyond the superlattice critical thickness, the present process will reduce the defect density between the superlattice and the substrate on which the superlattice is grown.

Example 1

Pillars of GaAs 2-μm highwere fabricated from a (001) GaAs substrate. The substrate was masked with photoresist, and $SiO_x$ was deposited in a variety o lateral geometries and dimensions from about 2 to 400 μm by electron beam evaporation. After removing the photoresist, the samples were then ion-beam etched to form 2-μm deep trenches producing pillars with very high aspect ratios. After treating with 10% HF acid and water solution to remove the $SiO_x$ from the top of the pillars, 200Å were etched to remove any additional contamination. A 1500Å buffer layer of GaAs was deposited by molecular beam epitaxy, followed by 3500Å of $In_{0.05}Ga_{0.95}As$. All layers were doped with Si to $10^{18}cm^{-3}$ to increase the amount of cathodoluminescence (CL). A schematic of the mismatched system is shown in FIGS. 1A.

The samples were analyzed with CL imaging. A JEOL JSM35CF scanning electron microscope was equipped with an annular Si PIN photodiode (Marek, J., et al, *J. Electrochem. Soc.*, 132:1502 (1985)). Electron beam x-ray analysis utilizing wavelength dispersive spectroscopy was used to analyze the In compositions from the islands. The composition was found to be $In_{0.05}Ga_{0.95}As$ on all island structures. The thickness and composition were also confirmed with Rutherford Backscatter Spectrometry.

Figure 2A:
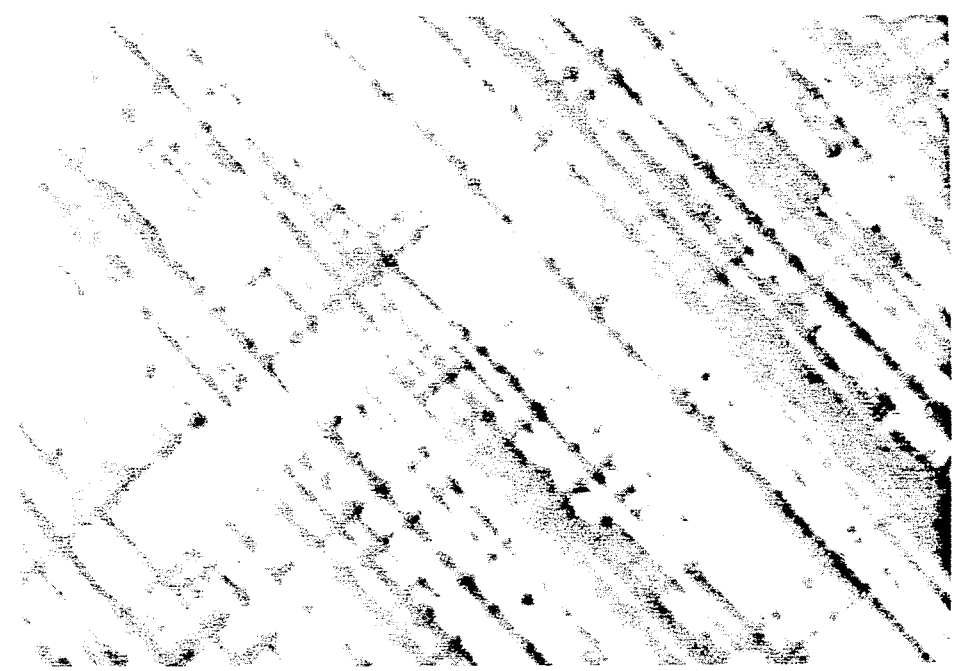
FIGS. 2A, 2B, and 2C represent cathodoluminescence (CL) images of the 3500Å. $In_{0.05}Ga_{0.95}As$ layer on GaAs with no lateral restriction prior to growth, with a 90-μm diameter pillar and with a 67-μm pillar respectively.

FIG. 2A is a CL image of the $In_{0.05}Ga_{0.95}As$ on GaAs without any lateral restriction (i.e. >>1000μm). The electron beam was scanned perpendicular the interface plane, and the microscope conditions were an electron accelerating voltage of 15keV and a beam current of 80 nA. Defects appear as dark lines in the image due to a decrease in the amount of band-gap radiation emitted in the vicinity of the detect. The high density of defects in FIG. 2A precluded the accurate determination of the dislocation density due to the spatial resolution limit of the CL technique. In high defect density interfaces, the dislocation density is actually much higher than the dark line defect density (Fitzgerald, E. A. et al, *J. Appl. Phys.*, 63 pp 693 (1988)). In FIG. 2A, one can estimate the llnear dislocation density to be greater than 5000 dislocations/cm.

Figure 2B:
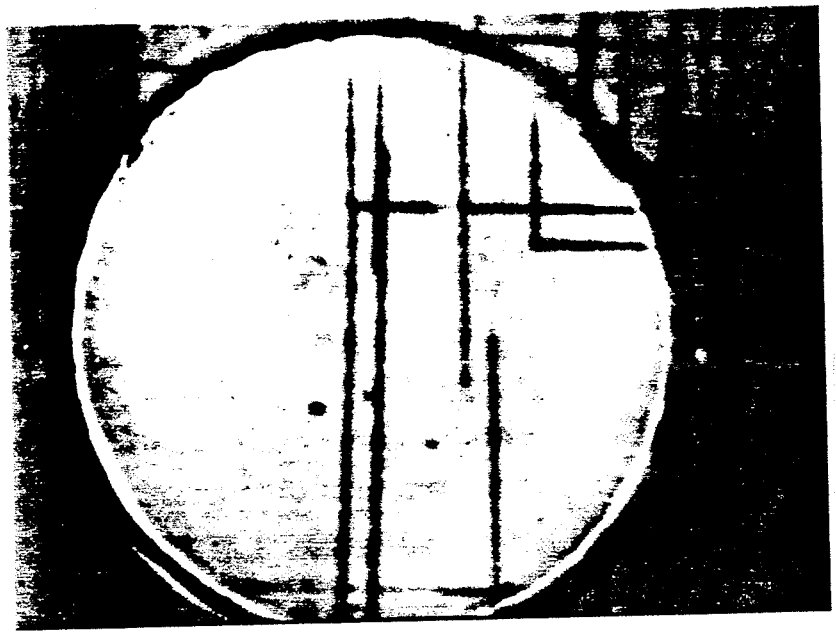
Figure 2C:
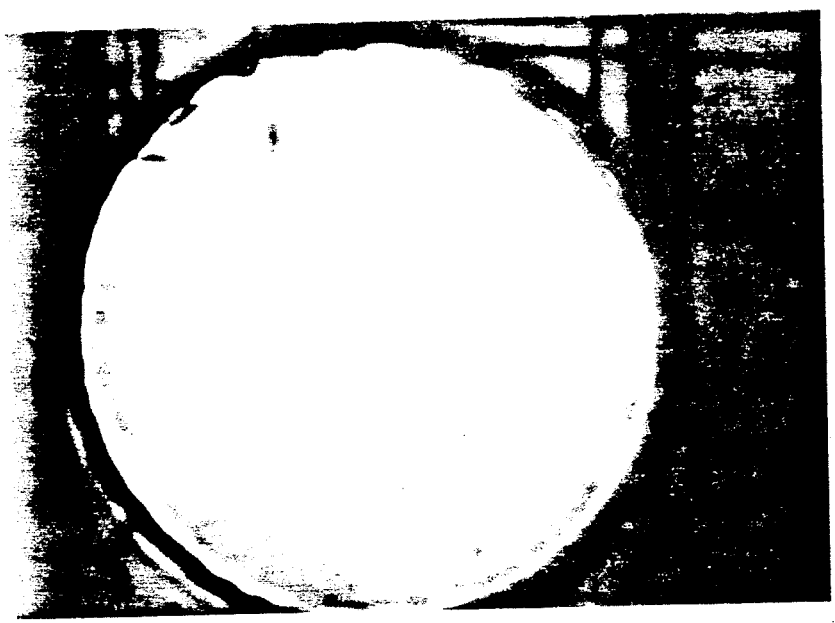

FIG. 2B is a CL image of a circular pillar with a diameter of 90 μm. On this pillar, the interface dislocation density has been drastically reduced. The defect density is low enough so that each dark line corresponds to a single misfit dislocation (Fitzgerald et al, *J. Appl. Phys.*, May 15, 1988). By decreasing the lateral dimension further, one eliminates the dislocations at the interface, as seen in FIG. 2C, which is a 67-μm diameter circular pillar. This effect is observed in other geometries as well, such as square and rectangular areas.

FIG. 3 is a plot of the linear dislocation density along each <110> direction vs. the diameter of the circular pillars. For each pillar size, a number of pillars were analyzed and an average dislocation density was calculated. The figure clearly shows an asymmetry in dislocation density for the two <110> directions. It is well known that misfit dislocations lying along the two <110> directions in a (001) plane (termed α and β) have different structure (Abrahams, M. S., et al, *Appl. Phys. Lett.*, 21:185 (1972)) and mobility (Steinhardt, H. et al., *Phys. Stat. Sol.*, 49:93 (1978)). This suggests that α dislocations nucleate more readily than β dislocations. In FIG. 3, we have plotted linear dislocation density, but we note that the number of dislocations in the smaller pillars (2-67 μm) varies from a mere 0-3 dislocations per pillar.

Figure 4:
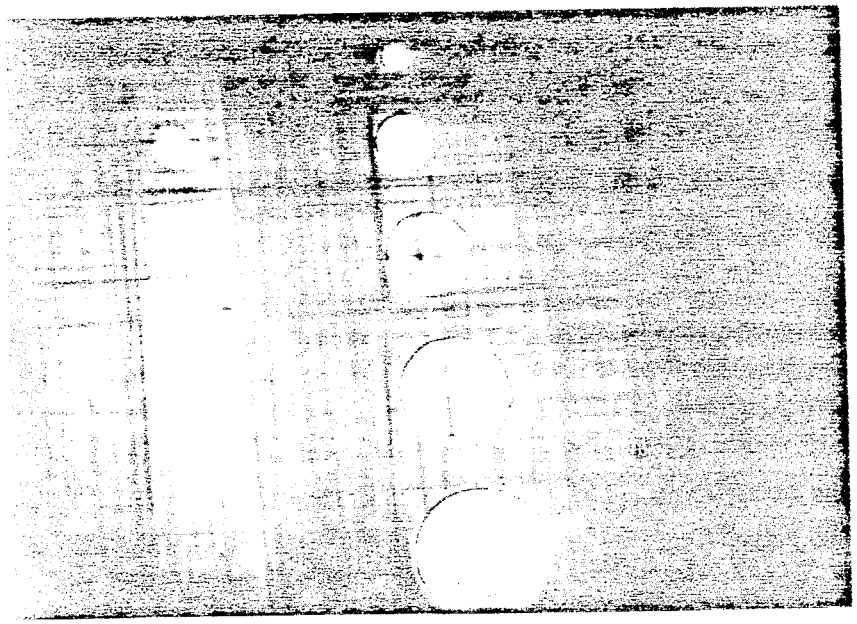
FIG. 4 is a CL image of a group of pillars of various dimensions which have prohibited the gliding of misfit dislocations.

Different kinds of lateral dimension reduction decrease the dislocation density. In FIG. 4, a group of circular pillars is shown, as well as a larger rectangular area. Note that in addition to preventing dislocations from propagating on top of the pillars, the structures block dislocations in the background interface plane as well. This is mostly easily seen in the area between the circular pillars where the dislocations are all in one direction; i.e. gliding misfit dislocations are blocked by the pillars, and the area in between &s not large enough to nucleate many misfit dislocations. Thus, lateral restriction prior to growth, either by artificial islands or walls, decreases the dislocation density.

When depositing epilayers on a large wafer, one has to contend with nucleation sites across an entire wafer; the nucleating dislocations can glide across the wafer area resulting in a high dislocation density. Also, many dislocation interactions occur and result in additional misfit dislocations. The reduction in lateral dimensional reduces the interface dislocation density by decreasing the number of active nucleation sites within that area and by presenting dislocation multiplication. If one assumes that there are a number of fixed nucleation sites per unit area that are responsible for the area dependence, and there is no dislocation multiplication, then the [110]line in FIG. 3 results in a misfit dislocation nucleation site density of $\approx 7 \times 10^4$ cm$^{-2}$ to $1.4 \times 10^5$ cm$^{-2}$. The density of dislocations in the substrate was $1.5 \times 10^5$ cm$^{-2}$, slightly greater than the calculated nucleation site density. But not all of the substrate threading dislocations are glissile 60° dislocations with Burgers vectors that can relieve stress at the interface. Therefore, the calculated density of nucleation sites using FIG. 3 suggests that threading dislocations are the primary source of misfit dislocations when other sources are inoperable. Also, because the [110]line in FIG. 2 nearly passes through zero, no other nucleation sites that are independent of area have become active.

It has been shown with respect to the present invention that reducing the lateral dimension of the growth surface, prior to growth, can reduce or eliminate misfit dislocation density for 3500Å ($\approx$4 times the critical thickness) of $In_{0.05}Ga_{0.95}As$ on (001) GaAs.

Example 2

Example 1 was repeated except that on the 1500 Å buffer layer of GaAs was epitaxially deposited 7000 Å of $In_{0.05}Ga_{0.95}As$. In this case the overlayer was 8 times the critical thickness. A plot of the dislocation density along each <110> direction vs. the diameter of the circular pillars was similar as that shown in FIG. 3.

What is claimed is:

1. A semiconductor material composite structure formed from crystal lattice mismatched semiconductor materials which comprises:
   a first semiconductor material layer having a multiplicity of pillars and adjacent wells; and
   a second semiconductor material layer deposited discontinuously on said first semiconductor pillars and wells to form an interface therewith;
   wherein said pillars, wells and said discontinuous layer have a lateral dimension from about 2μm to about 5000μm; and wherein the second semiconductor is deposited on the pillars and wells in excess of the critical thickness defined as the thickness at which a comparable composite having a lateral measurement of greater than 5000μm exceeds a dislocation density of 100 dislocations per centimeter.

2. The mismatched structure of claim 1 having a pillar height of from about 10Å to about 500 μm and a second semiconductor having a thickness up to about ten times the critical thickness, and where the density of dislocations at the interface between the first semiconductor layer and the second semiconductor layer is from about 0 to substantially less than the value of the dislocation density for a mismatched structure having a lateral dimension of at least 5000 μm.

3. The mismatched structure of claim 2 wherein the number of dislocations at the interface between the first semiconductor material and the second semiconductor layer is from about 0 to about 1000 dislocations per centimeter.

4. The composite of claim 2 wherein the height of said pillar is sufficient to accept the second semiconductor deposit on the pillar and well in a thickness up to about 1-5 times the critical thickness; wherein the pillars are fabricated in a design to provide a discontinuity in the deposited second semiconductor layer thus controlling the defect density at the interface by limiting the lateral dimension of the deposited semiconductor layer on the pillar and well.

5. The composite of claim 4 wherein the pillar height is from about 10Å to 2 μm and the lateral dimension of the pillar and well is from about 15 to about 200 μm.

6. The structure of claim 4 where the pillars are cylindrical.

7. The structure of claim 6 wherein the pillars have a top planar section, and sloping side walls that undercut the top portion of the pillar in a manner sufficient to effect the discontinuity of the applied layer.

8. The structure of claim 7 wherein the lateral dimension of the discontinuous applied layer is from about 15 μm to about 100 μm.

9. The structure of claim 3 wherein the crystal lattice semiconductor composite is represented by the formulas: $M^1{}_xM^2{}_{1-x}M^3{}_yM^4{}_{1-y}/M^5{}_zM^6{}_{1-z}M^7{}_wM^8{}_{1-w}$; $M^1{}_xM^2{}_{1-x}M^3{}_yM^4{}_{1-y}/M^9$; and $M^9{}_xM^{10}{}_{1-x}/M^{10}$ or their inverse counterpart where $M^1$, $M^2$, $M^5$ and $M^6$ are elements of Group IIIA and Group IIB; $M^3$, $M^4$, $M^7$ and $M^8$ are elements of Group VA and Group VIA and $M^9$ and $M^{10}$ are elements of Group IVA of the periodic table of elements and where W, X, Y and Z are values from 0 to 1.

10. The structure of claim 10 where the composite comprises In 95 As/GaAs or its inverse.

11. The structure of claim 3 wherein the crystal lattice semiconductor composite is represented by the formulas $M^1{}_xM^2{}_{1-x}M^3{}_yM^4{}_{1-y}/M^9$ and $M^9/M^{10}$ wherein $M^1$, $M^2$ are elements of Group IIIA; $M^3$, $M^4$ are elements of Group VA; and where $M^9$ and $M^{10}$ are elements of Group IV of the periodic table of elements.

12. The structure of claim 1 wherein the mismatched composite comprises $In_xGa_{1-x}As/(001)$ GaAs or its inverse and where x has a value from 0 to 1.

13. The structure of claim 1 where the composite comprises GaAs on Si or its inverse.

14. The structure of claim 1 where the composite comprises $In_xGa_{1-x}As$ on $In_yGa_{1-y}As$ where x and y have values from 0 to 1 and x is not equal to y.

15. The structure of claim 1 where the composite comprises $Si_xGe_{1-x}$ on Si or its inverse, where x is a value from 0 to 1.

16. The structure of claim 1 where the composite comprises GaAs on $Si_xGe_{1-x}$ or its inverse, where x has a value between 0 and 1.

17. The structure of claim 1 where the composite comprises layers of ZnSe and GaAs.

* * * * *

UNITED STATES PATENT AND TRADEMARK OFFICE
CERTIFICATE OF CORRECTION

PATENT NO. : 5,032,893
DATED : July 16, 1991
INVENTOR(S) : Fitzgerald, Jr.

It is certified that error appears in the above-identified patent and that said Letters Patent is hereby corrected as shown below:

Claim 10, line 40, column 10, change the dependency from "10" to --9--.

Claim 10, line 41, column 10, the formula "In 95 As/GaAs" should be --$In_{0.05}Ga_{0.95}As/GaAs$--.

Claim 11, line 44, column 10, "$M^9/M^{10}$" should be --$M^9_x M^{10}_{1-x}/M^{10}$--.

Signed and Sealed this

First Day of December, 1992

Attest:

DOUGLAS B. COMER

*Attesting Officer*   *Acting Commissioner of Patents and Trademarks*